United States Patent
Cong et al.

(10) Patent No.: US 11,948,818 B2
(45) Date of Patent: Apr. 2, 2024

(54) TEMPERATURE CALIBRATION WITH DEPOSITION AND ETCH PROCESS

(71) Applicant: Applied Materials, Inc., Santa Clara, CA (US)

(72) Inventors: Zhepeng Cong, San Jose, CA (US); Tao Sheng, Santa Clara, CA (US); Vinh N. Tran, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 17/546,769

(22) Filed: Dec. 9, 2021

(65) Prior Publication Data

US 2023/0187240 A1   Jun. 15, 2023

(51) Int. Cl.
*H01L 21/67* (2006.01)
*G01J 5/00* (2022.01)
*H01L 21/3065* (2006.01)

(52) U.S. Cl.
CPC ...... *H01L 21/67248* (2013.01); *G01J 5/0007* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 6,022,749 A | 2/2000 | Davis et al. | |
| 6,876,442 B2 | 4/2005 | Vatus et al. | |
| 8,726,837 B2 | 5/2014 | Patalay et al. | |
| 9,959,610 B2 | 5/2018 | Tertitski et al. | |
| 2009/0016406 A1 | 1/2009 | Ravi et al. | |
| 2012/0227665 A1 | 9/2012 | Ozgun et al. | |
| 2021/0043524 A1 | 2/2021 | Chen et al. | |

FOREIGN PATENT DOCUMENTS

| | | | |
|---|---|---|---|
| JP | 2010-040575 A | | 2/2010 |
| JP | 2010040575 | * | 2/2010 |
| WO | 2015-116428 A1 | | 8/2015 |

OTHER PUBLICATIONS

International Search Report and Written Opinion dated Nov. 3, 2022 for Application No. PCT/US2022/036897, whole document.

* cited by examiner

*Primary Examiner* — Stephanie P Duclair
(74) *Attorney, Agent, or Firm* — Patterson + Sheridan, LLP (57) ABSTRACT

A method and apparatus for calibrating a temperature within a processing chamber are described. The method includes determining an etch rate of a layer within the processing chamber. The processing chamber is a deposition chamber configured for use during semiconductor manufacturing. The etch rate is utilized to determine a temperature within the processing chamber. The temperature within the processing chamber is then subsequently compared to a calibrated temperature to determine a temperature offset. The etch rate is determined using any one of a pyrometer, a reflectometer, a camera, or a mass sensor.

20 Claims, 6 Drawing Sheets

TEMPERATURE CALIBRATION WITH DEPOSITION AND ETCH PROCESS

BACKGROUND

Field

Embodiments of the present disclosure generally relate to a methods and apparatus for calibrating a temperature of a process chamber. More specifically, the application relates to non-contact methods of calibrating a temperature of a semiconductor processing chamber.

Description of the Related Art

Semiconductor substrates are processed for a wide variety of applications, including the fabrication of integrated devices and microdevices. During processing, the substrate is positioned on a substrate support within a process chamber. The substrate support is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

Over time, aging of heating sources as well as buildup of films on surfaces within the process chamber reduce the accuracy and precision of heating within the process chamber. Process chambers may be manually re-calibrated periodically during preventative maintenance in order to improve the accuracy and precision of heating within the process chamber. Re-calibrating a process chamber causes prolonged down times of the process chamber. The prolonged down times cause reduced throughput and increased cost of ownership. Re-calibration methods also generally utilize substrates or additional equipment which is removed from the process chamber after re-calibration is performed. The additional test substrates and/or equipment further adds to the cost of performing calibration routines.

Therefore, a need exists for improved apparatus and methods for re-calibrating temperatures within a process chamber.

SUMMARY

The present disclosure generally relates to a method of calibrating a temperature of a process chamber. The method is suitable for use in semiconductor manufacturing. The method includes performing a first procedure. The first procedure further includes (a) flowing a gas into a process volume while the process volume is at a first pressure; (b) setting a temperature of a substrate support within the process volume to a first temperature; (c) depositing a first layer of a film on the substrate support using the gas, the first layer having a first thickness; (d) etching the first layer of the film from the substrate support at the first temperature; (e) determining an etch rate of the etching the first layer at the first temperature; and (f) storing the etch rate relative to the first temperature at a first temperature etch rate. The method further includes repeating each of operations (a)-(f) at a second temperature different from the first temperature to obtain a second temperature etch rate. A measured temperature curve is determined from at least the first temperature etch rate and the second temperature etch rate. The measured temperature curve is compared to a calibration temperature curve.

In another embodiment, a method of determining a temperature of a process chamber is described. The method is suitable for use in semiconductor manufacturing. The method includes performing a first procedure. The first procedure includes (a) flowing a gas into a process volume; (b) setting a temperature of a substrate support within the process volume to a first temperature; (c) depositing a first layer on the substrate support using the gas, the first layer having a first thickness; (d) etching the first layer from the substrate support at the first temperature to a second thickness less than the first thickness; and (e) determining a first temperature etch rate of the etching the first layer at the first temperature using one or more pyrometers, one or more cameras, one or more strain gauges, or one or more piezoelectric sensors. The method further includes repeating each of operations (a)-(e) within the first procedure at a second temperature different from the first temperature to obtain a second temperature etch rate. The method further includes determining a measured temperature curve from at least the first temperature etch rate and the second temperature etch rate.

In another embodiment, a non-transitory computer-readable medium is described. The non-transitory computer-readable medium stores instructions that, when executed by a processor, cause a computer system to perform an operation. The operation includes performing a first procedure. The first procedure includes (a) flowing a gas into a process volume; (b) setting a temperature of a substrate support within the process volume to a first temperature; (c) depositing a first layer on the substrate support using the gas, the first layer having a first thickness; (d) etching the first layer from the substrate support at the first temperature to a second thickness less than the first thickness; and (e) determining a first temperature etch rate of the etching the first layer at the first temperature using one or more sensors. The instructions further include repeating each of operations (a)-(e) within the first procedure at a second temperature different from the first temperature to obtain a second temperature etch rate. The instructions further include determining a measured temperature curve from at least the first temperature etch rate and the second temperature etch rate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a method and apparatus for calibrating a temperature of a process chamber. More specifically, the method is directed towards calibrating a temperature of a semiconductor processing chamber used for epitaxial deposition, although use in other chambers is contemplated. The method utilizes the measurement of an etch rate to determine a temperature of a process chamber. For some temperatures, the growth rate of a layer on a substrate and/or on a substrate support is not easily associated with a temperature of the substrate support or the process chamber. However, it has been found an etch rate of a layer within a process chamber may be utilized to determine a temperature within the process chamber.

The etch rate is dependent upon the temperature of a substrate support and the process chamber over a wide temperature range. The etch rate may be utilized both for temperatures below 1000° C. or above 1000° C. The temperature calibration methods described herein may be used over a temperature range of 500° C. to about 1500° C. Utilizing the etch rate of a film formed on the substrate support to determine a temperature and/or temperature offset further enables the ability to increase the accuracy of the temperature measurement as the impact of variables such as coating formation on windows, substrate support aging, or pyrometer drift are reduced or eliminated.

The method of determining the temperature using the etch rate may be automated and does not necessitate the use of a substrate during calibration. Therefore, the temperature determination method may be performed multiple times at different temperatures and a temperature curve is estimated from the data points. The temperature curve may be compared to a calibration temperature curve. The calibration temperature curve is a predetermined curve from a baseline calibration chamber and/or historical data of the chamber being utilized.

By comparing the temperature curve determined using the etch rates and the calibration temperature curve, a correction factor may be determined for one or both of the temperature sensors and the heat sources. If, after applying the correction factor, the temperature curve is still outside of a set tolerance range around the calibration temperature curve, an error is reported and other components and/or process inputs are evaluated for potential causes of the error.

Figure 1:
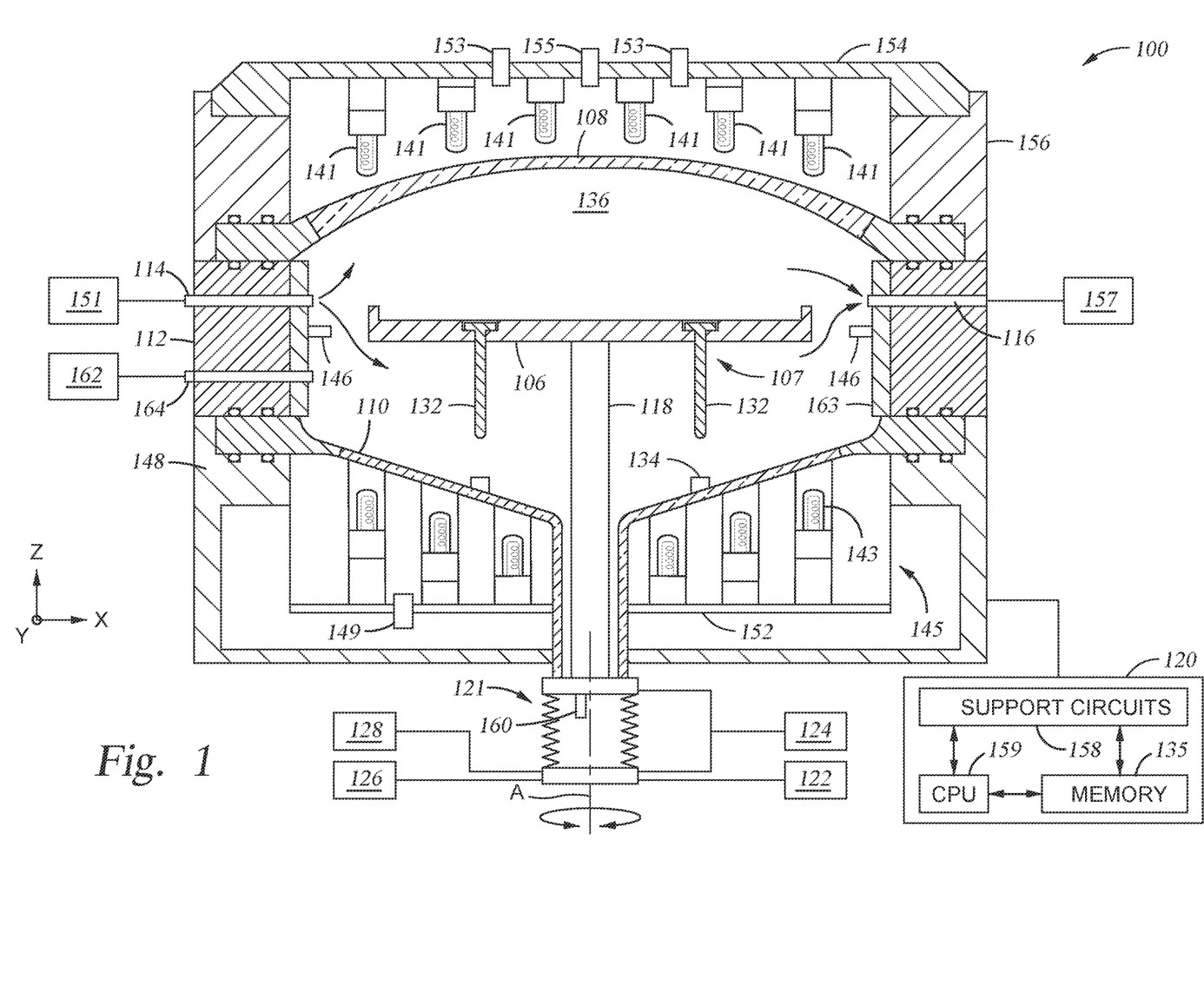
FIG. 1 is a schematic illustration of a deposition chamber, according to one embodiment of the disclosure.

FIG. 1 is a schematic illustration of a type of process chamber 100 according to one embodiment of the present disclosure. The process chamber 100 is a semiconductor processing chamber and may be a deposition chamber. The process chamber 100 as described herein is utilized to grow an epitaxial film on a substrate (not shown). The process chamber 100 creates a cross-flow of precursors across the top surface of the substrate.

The process chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper dome 108, a lower dome 110, a plurality of upper lamps 141, and a plurality of lower lamps 143.

As shown, the controller 120 is in communication with the process chamber 100 and is used to control processes, such as those described herein. The controller 120 includes a central processing unit (CPU) 159, a memory device 135, and support circuits 158. The controller 120 may control the process chamber 100 directly, or via other computers or controllers (not shown) associated with particular support system components. The controller 120 may be one of any form of general-purpose computer processor that can be used in an industrial setting for controlling various chambers and sub-processors. The memory device 135, or computer-readable medium, may be one or more of readily available memory such as random access memory (RAM), read only memory (ROM), floppy disk, hard disk, flash drive, or any other form of digital storage, local or remote. The support circuits 158 are coupled to the CPU 159 for supporting the processor in a conventional manner. The support circuits 158 include cache, power supplies, clock circuits, input/output circuitry and subsystems, and the like. Processing steps may be stored in the memory device 135 as a software routine that may be executed or invoked to turn the controller 120 into a specific purpose controller to control the operations of the process chamber 100. The controller 120 may be configured to perform any methods described herein.

The substrate support 106 is disposed between the upper dome 108 and the lower dome 110. The plurality of upper lamps 141 are disposed between the upper dome 108 and a lid 154. The lid 154 includes a plurality of sensors 153, 155 disposed therein for measuring the temperature within the process chamber 100. The plurality of lower lamps 143 are disposed between the lower dome 110 and a floor 152. The plurality of lower lamps 143 form a lower lamp assembly 145. Each of the plurality of sensors 153, 155 may be a camera, a pyrometer, or a reflectometer. One of the sensors 153, 155 is a calibration sensor 155. The calibration sensor 155 is configured to assist in the temperature calibration methods described herein. Other sensors, such as the sensors 153, are pyrometers and configured to measure a temperature of a top surface of the substrate.

At least one lower calibration sensor 149 is disposed through the floor 152 of the process chamber 100. The calibration sensor 149 are similar to the calibration sensor 155. The calibration sensor 149 is oriented towards a bottom surface of the substrate support 106.

A processing volume 136 is formed between the upper dome 108 and the lower dome 110. The processing volume 136 has the substrate support 106 disposed therein. The substrate support 106 includes a top surface 202 (FIGS. 2A-2C) on which the substrate is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the process chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate from the substrate support 106 either before or after a deposition process is performed. The lift pins 132 may rest on lift pin stops 134 when the substrate support 106 is lowered from a processing position to a transfer position.

A mass sensor 160 is optionally coupled to the shaft 118 of the substrate support 106. The mass sensor 160 is configured to measure a mass and/or a weight of the substrate support 106 and/or a coating thickness on the substrate support 106. The mass sensor 160 may be a strain gauge or a piezoelectric sensor. The strain gauge may be an optical strain gauge or an electric strain gauge. The mass sensor 160 is disposed below the shaft 118, such that at least part of the mass of the substrate support 106 is supported by the mass sensor 160. The mass sensor 160 is disposed below a bearing, such as a ball bearing assembly. The ball bearing assembly is configured to support at least part of the weight of the substrate support 106 and is disposed between the mass sensor 160 and the shaft 118 of the substrate support 106.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface of a substrate (not shown) disposed within the processing volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

Figure 2A:
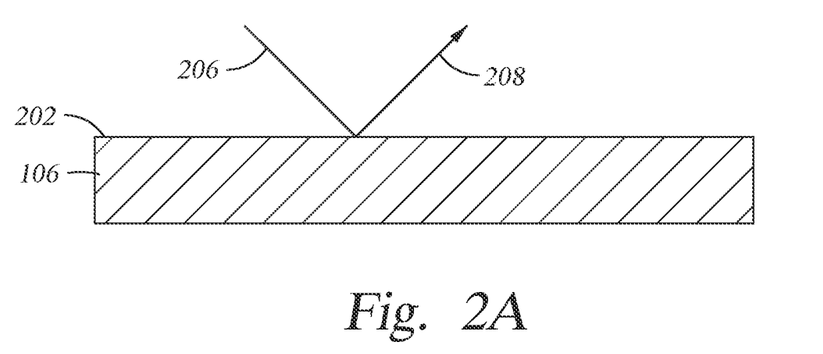
FIGS. 2A-2C illustrate schematic cross-sectional views of a portion of a substrate support, according to one embodiment.
Figure 2B:
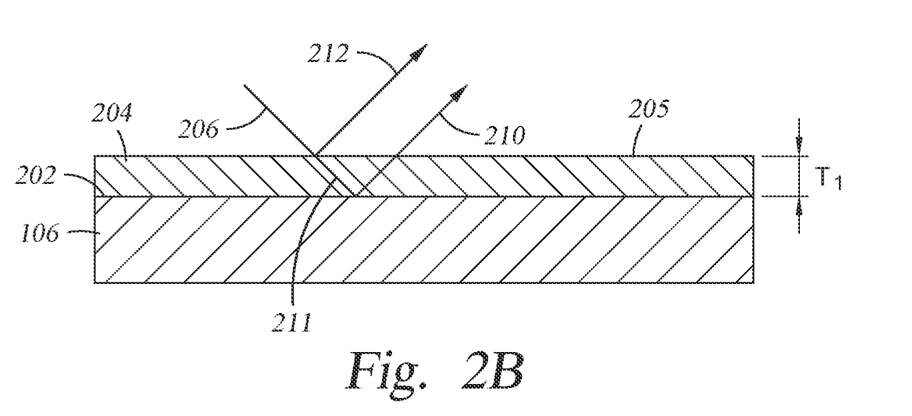
Figure 2C:
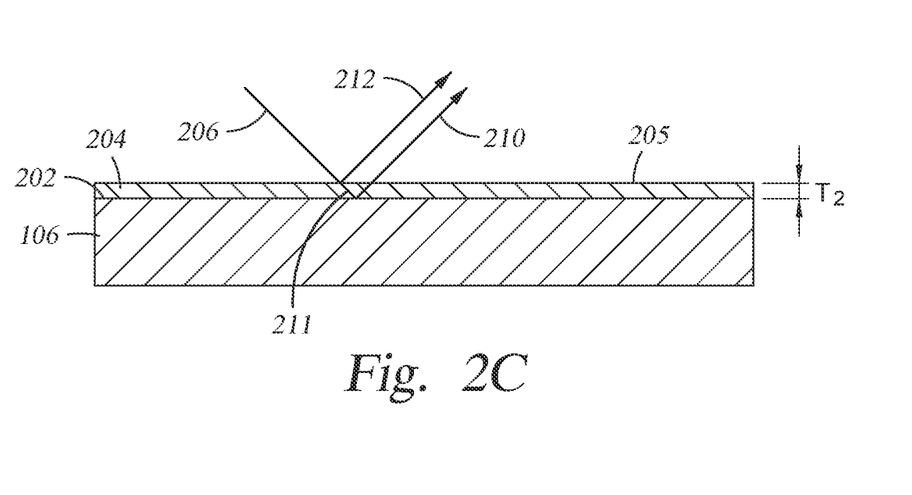

FIGS. 2A-2C illustrate schematic cross-sectional views of a portion of a substrate support 106. As shown in FIG. 2A, the substrate support 106 has a top surface 202. The top surface 202 may be configured to hold a substrate (not shown). During growth and etch rate methods described herein, the top surface 202 does not include a substrate disposed thereon. The substrate support 106 is a quartz, silicon carbide, or a graphite coated material, although other materials are also contemplated. The top surface 202 of the substrate support 106 is configured to reflect a specific wavelength of radiation, such that a radiation beam 206 is reflected off of the top surface 202 as a fully reflected radiation beam 208. Some of the radiation beam 206 may be absorbed by the substrate support 106.

In embodiments wherein the calibration sensor 155 is a pyrometer, the radiation beam 206 may be output by the calibration sensor 155. The calibration sensor 155 is configured to receive the fully reflected radiation beam 208 and measure the intensity of the fully reflected radiation beam 208. The radiation beam 206 emitted by the calibration sensor 155 has a wavelength with a band of less than about 3700 nm, such as a band of less than about 3300 nm, such as a band of less than about 2000 nm, such as a band of less than about 400 nm. Therefore, the total range of wavelengths emitted by the calibration sensor 155 is less than about 3700 nm, such as less than about 3300 nm, such as less than about 2000 nm. The wavelengths of the radiation beam 206 as emitted by the calibration sensor 155 are about 400 nm to about 3700 nm, such as about 500 nm to about 3000 nm, such as about 1000 nm to about 2500 nm.

Figure 3:
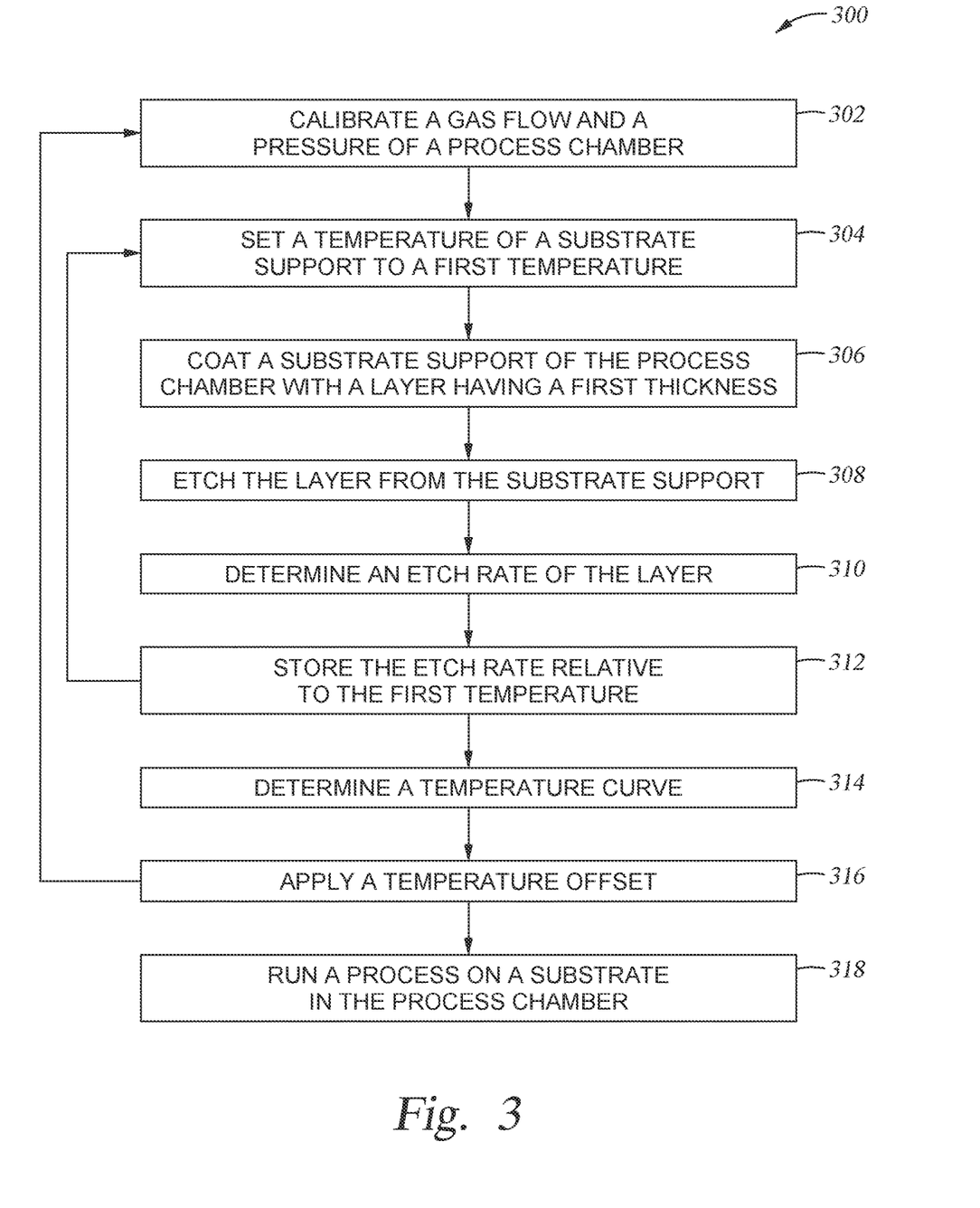
FIG. 3 illustrates a method of calibrating a temperature of the deposition chamber of FIG. 1, according to one embodiment.

As described with respect to a method 300 of FIG. 3, a layer 204 is deposited onto the top surface 202 of the substrate support 106 (FIG. 2B). The layer 204 is grown to a first thickness $T_1$. The first thickness $T_1$ is about 400 nm to about 5500 nm, such as about 500 nm to about 5000 nm, such as about 500 nm to about 3000 nm. Other thicknesses are also contemplated, dependent upon gas flow rate, concentrations, and precursor materials. The layer 204 may be described as a first layer or a coating layer on the substrate support 106. In some embodiments, a separate protective coating (not shown) is formed on the substrate support 106 before deposition of the layer 204 thereon. The layer 204 is a silicon containing layer or a germanium containing layer. In some embodiments, the layer 204 is a silicon layer, such as a polycrystalline silicon layer, and is formed using one or a combination of silane ($SiH_4$), disilane ($Si_2H_6$), trisilane ($Si_3H_8$), chlorosilane ($SiH_3Cl$), dichlorosilane ($SiH_2Cl_2$), trichlorosilane ($SiHCl_3$), and tetrachlorosilane ($SiCl_4$). In some embodiments, only one precursor is utilized, such that film growth and etch rates are more easily controlled. In other embodiments, additional precursors may be combined with the silicon containing precursor, such that the layer 204 has desired properties, such as a desired reflectance, absorption, growth rate, and/or etch rate. As described herein, the material and thickness of the layer 204 is configured to be measurable by one or more calibration sensors 155. In embodiments wherein the calibration sensor 155 is a camera, an emissivity of the layer 204 is measured. In embodiments wherein the calibration sensor 155 is a pyrometer and/or a reflectometer, the intensity of different wavelengths reflected by the layer 204 is measured.

As shown in FIG. 2B, the layer 204 reflects a first reflected radiation beam 212 off of a layer surface 205. The layer surface 205 is the top surface of the layer 204. The first reflected radiation beam 212 is a portion of the radiation beam 206. A transmitted radiation beam 211 continues through the layer 204 and is a second portion of the radiation beam 206 not reflected as the first reflected radiation beam 212. The transmitted radiation beam 211 passes through the layer 204 and at least part of the transmitted radiation beam 211 is reflected off of the top surface 202 of the substrate support 106 as a second reflected radiation beam 210. The second reflected radiation beam 210 may be combined with the first reflected radiation beam 212 and performs either constructive or destructive interference. The constructive or destructive interference may be measured over time to determine a thickness of the deposited layer 204 (based on the wavelength of the calibration sensor 155, material properties of the layer 204, and the measured constructive/destructive interference). The thickness of the layer 204 facilitates determination of a growth rate and an etch rate of the layer 204.

FIG. 2C illustrates a portion of the substrate support 106 after a portion of the layer 204 has been etched. The etched layer 204 has a second thickness $T_2$. The difference between the first thickness $T_1$ and the second thickness $T_2$ is measured to determine an etch rate of the layer 204 as described in the method 300. In one example, the entirety of layer 204 is removed during etching.

FIG. 3 illustrates a method 300 of calibrating a temperature of a process chamber, such as the process chamber 100 of FIG. 1. Similar methods 300 may also be utilized on other types of process chambers. The method 300 is performed without a substrate within the process chamber 100. The method 300 may be stored and executed by the controller 120, such that the memory device 135 stores the method 300 and the method 300 is executed by the CPU 159. The method 300 utilizes the growth and etch of a layer, such as the layer 204 on a substrate support, such as the substrate support 106, to determine a temperature of the process chamber, and thus usable to calibrate temperature measurement devices within the process chamber.

The method 300 includes an operation 302 of calibrating a gas flow into the process chamber and a pressure within a processing volume, such as the processing volume 136, of the process chamber. The gas flow calibration may include calibrating one or both of a deposition gas and a cleaning gas. The deposition gas is the gas utilized to deposit the layer 204 on the substrate support. The cleaning gas is the gas utilized to etch the layer 204 from the substrate support. The gas flow calibration is performed to enable accurate flow rates and accurate gas/precursor concentrations into the processing volume. Accurate flow rates and gas/precursor concentrations increases the accuracy of the method 300 by reducing sources of potential error. The flow rates and gas/precursor concentrations are calibrated to be precise to within less than about a 5% tolerance window, such that the flow rates and the gas/precursor concentrations are within ±5% of the desired flow rates and/or gas/precursor concentrations. In some embodiments, the flow rates and gas/precursor concentrations are calibrated to be within less than about a 3% tolerance window, such as less than about a 2% tolerance window, such as less than about a 1% tolerance window, such as less than about a 0.5% tolerance window.

The pressure within the processing volume is similarly calibrated, such that the pressure within the processing volume is calibrated to be within a less than about a 5% tolerance window of the desired process pressure. In some embodiments, the pressure is less than about a 3% tolerance window, such as less than about a 2% tolerance window, such as less than about a 1% tolerance window, such as less than about a 0.5% tolerance window. Accurate pressures within the processing volume increases the accuracy of the method 300 by reducing sources of potential error.

Once the pressure, flow rates, and gas/precursor concentrations are calibrated during the operation 302, a first procedure begins. The first procedure includes an operation 304 of setting a temperature of one or both of the processing volume and the substrate support to a first temperature. The processing volume and the substrate support are held at the first temperature during the first procedure. Setting the temperature to the first temperature includes heating and/or cooling the substrate support and the processing volume using one or more lamps and/or heaters disposed within the substrate support. The first temperature may be greater than about 1000° C. or less than about 1000° C. In some embodiments, the first temperature is about 500° C. to about 1500° C., such as about 600° C. to about 1300° C., such as about 800° C. to about 1000° C. In some embodiments, the first temperature is greater than 1000° C., such as greater than about 1100° C. It has been found the growth rate of the layer may be utilized to determine a temperature for some temperatures, such as a temperature of less than about 1000° C. However, growth rates at high-temperatures, such as growth at temperatures above about 1000° C., is not as temperature dependent and is therefore difficult to determine from a growth rate. For example, growth of films at temperatures above about 1000° C. tends to be mass transfer dependent rather than temperature dependent.

Once the temperature of the substrate support and the processing volume have been set to the first temperature, another operation 306 is performed. The operation 306 includes coating the substrate support within the process chamber with a layer, such as the layer 204. The layer is a silicon or a germanium containing layer. The layer is grown for a first time period to the first thickness $T_1$. The growth of the layer is performed for a pre-determined first time period or until a desired first thickness $T_1$ is reached. In embodiments wherein the layer is grown for a pre-determined first time period, the first thickness $T_1$ varies slightly between runs of the process chamber. In embodiments wherein the layer is grown to the first thickness $T_1$, the first time period varies slightly between each run of the process chamber. In some embodiments, the layer is a silicon layer and is formed using one or a combination of silane ($SiH_4$), disilane ($Si_2H_6$), trisilane ($Si_3H_8$), chlorosilane ($SiH_3Cl$), dichlorosilane ($SiH_2Cl_2$), trichlorosilane ($SiHCl_3$), and tetrachlorosilane ($SiCl_4$). In one example, the process chamber is configured to use the same gases to process substrates and to deposit the layer 204, thus simplifying the calibration process. Other precursors may be combined with the silicon containing precursor, such that the layer has desired properties, such as a desired reflectance, absorption, growth rate, and/or etch rate.

As described herein, the material and thickness of the layer is configured to be measurable by one or more calibration sensors, such as the calibration sensors 155 or the mass sensor 160. The first thickness $T_1$ of the layer is determined during the operation 306. Determining the first thickness $T_1$ performed using one of several different measurement techniques. These techniques include a first thickness determining method using a camera and a calibrated growth process. A second thickness determining method utilizes a pyrometer and/or a reflectometer to measure constructive/destructive interference of the layer being grown. A third thickness determining method utilizes a mass sensor, such as a strain gauge or a piezoelectric sensor to determine the coating thickness on the substrate support. It is contemplated that one or more of the first, the second, or the third thickness determining methods may be utilized.

The first thickness determining method determines the first thickness $T_1$ by performing a calibrated growth process. The calibrated growth process is a process performed for a pre-determined time and at pre-determined processing conditions. The calibrated growth process has been previously calibrated, such that by performing the calibrated growth process at the pre-determined processing conditions and time, the first thickness $T_1$ is able to be closely estimated. The calibration is performed during a previous operation or during a previous maintenance procedure. The calibration process involves performing the layer growth on the substrate at the pre-determined processing conditions and time. The layer thickness is then measured using one or more methods. Measuring the layer thickness may be performed using a contact thickness measurement or a non-contact thickness measurement. A contact thickness measurement may be performed manually or automatically.

Once the thickness of the layer grown during the calibration process is known, the growth process is calibrated and the layer is assumed to have a similar thickness for each repetition of the calibrated growth process. Therefore, the first thickness $T_1$ is assumed to be the same as the layer thickness measured during the calibration process.

The second thickness determining method includes utilizing a pyrometer and/or a reflectometer to measure interference signals of the layer as it is grown. Therefore, determining the first thickness $T_1$ is performed by monitoring the construction/destruction of reflected radiation during the deposition. One or more calibration sensors, such as one or a combination of a pyrometer and a reflectometer, may be utilized to determine the first thickness $T_1$.

The pyrometer and/or the reflectometer measure the growth of the layer over time by recording the intensity of certain wavelengths of a radiation beam as the radiation beam reflects off of the top surface of the substrate support and the layer as described in FIG. 2B. The intensity may form an oscillating curve due to the constructive and destructive interference caused by the changing thickness of the layer. Based on the known wavelength of the calibration sensors 155 and the measured oscillations, a thickness of the layer 204 can be determined.

Figure 5A:
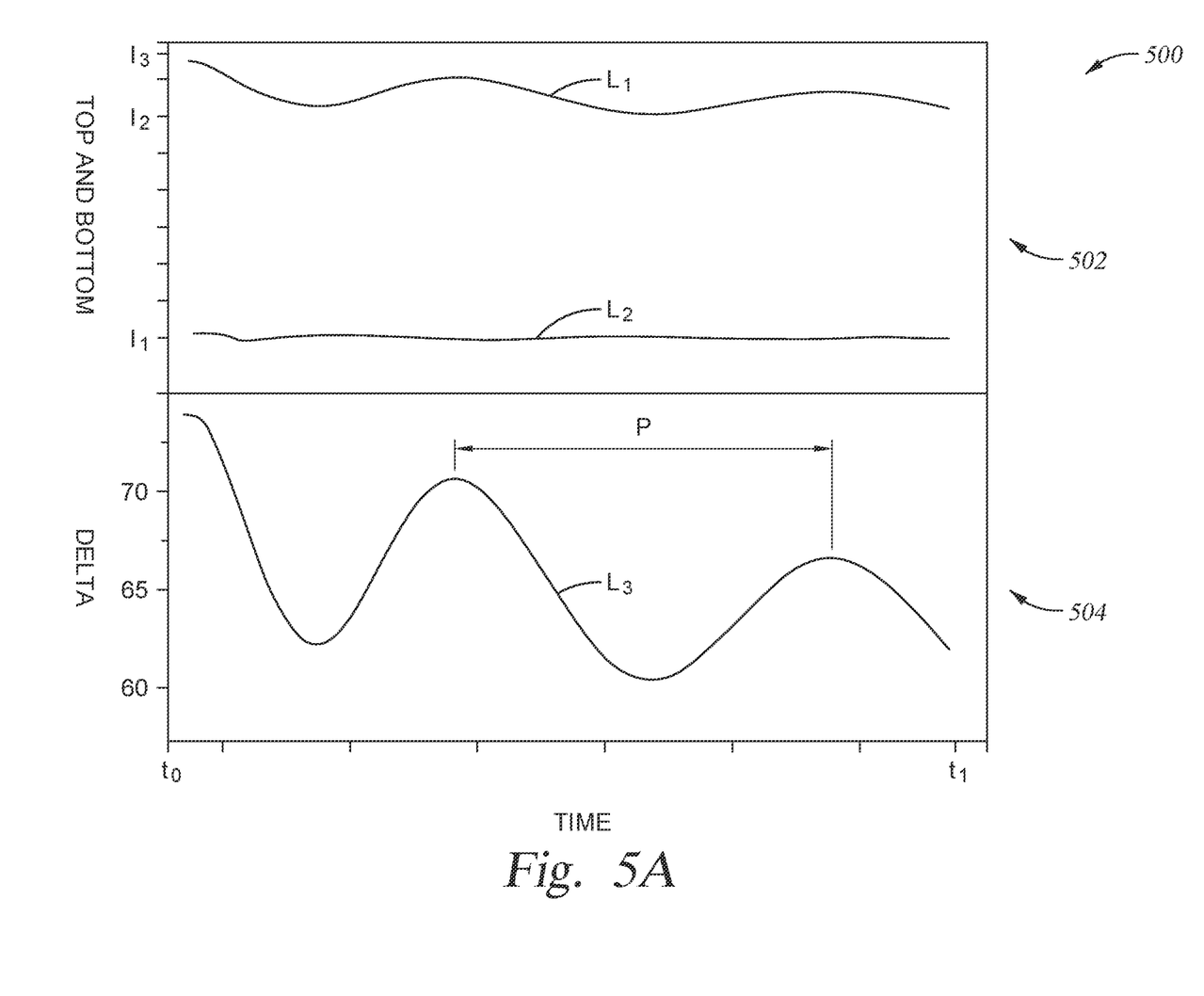
FIGS. 5A and 5B are graphs illustrating wavelength intensity changes during layer growth and layer etch processes.

FIG. 5A is one illustration of a graph 500 which may be utilized to determine the first thickness $T_1$ using a pyrometer and/or a reflectometer. The graph 500 measures radiation intensity over time, such that intensity measurements begin at a first time $t_0$ and end at a second time $t_1$. The first time $t_0$ is an initial measurement start time or an initial recording start time. The second time $t_1$ is an end measurement time or a final recorded time. As seen in an upper portion 502 of the graph 500, a first intensity curve $L_1$ and a second intensity curve $L_2$ are measured using one or more pyrometers and/or reflectometers. The first intensity curve $L_1$ is the intensity of radiation reflected off of the top surface of the substrate support and the layer. The first intensity curve $L_1$ is measured using a pyrometer and/or a reflectometer disposed above the substrate support, such as the calibration sensor 155. The pyrometer and/or reflectometer is configured to have a narrow measurement band to reduce interference with other stray radiation within the process chamber. The intensity of the first intensity curve $L_1$ varies over time while a layer is being grown on the substrate support. The varying intensity over time is attributed to the radiation beam reflected off of the substrate support changing from constructive to destructive interference and vice versa as the thickness of the layer 204 increases.

The second intensity curve $L_2$ is the intensity of radiation reflected off of the bottom surface of the substrate support. The second intensity curve $L_2$ is measured using a pyrometer and/or a reflectometer disposed below the substrate support, such as the lower calibration sensor 149. The pyrometer and/or reflectometer is configured to have a narrow measurement band to reduce interference with stray radiation within the process chamber. The intensity of the second intensity curve $L_2$ is shown to be relatively constant at a first intensity $I_1$. The first intensity $I_1$ is mostly constant as the layer does not grow on the bottom surface of the substrate support and therefore there is no constructive or destructive interference caused by the growth of the layer. The first intensity curve $L_1$ however, varies between a second intensity $I_2$ and a third intensity $I_3$ as the first intensity curve $L_1$ oscillates between constructive and destructive interference.

A difference between each of the first intensity curve $L_1$ and the second intensity curve $L_2$ is taken to obtain a third intensity curve $L_3$ as shown in the lower portion 504 of the graph 500. The second intensity curve $L_2$ serves as a baseline intensity curve, such that variation caused by factors other than deposition of a layer on the substrate support may be removed from the first intensity curve $L_1$. Therefore, an intensity of the third intensity curve $L_3$ is the difference in intensity between the first intensity curve $L_1$ and the second intensity curve $L_2$. A period P of the third intensity curve $L_3$ may be determined. The number of periods P may be utilized to determine a total thickness of a layer being grown on the substrate support. Therefore, a thickness (and correspondingly, a growth rate if deposition time is tracked) may be determined using a pyrometer and/or a reflectometer.

The third thickness determining method utilizes a mass sensor, such as the mass sensor 160, to determine the first thickness $T_1$. The mass sensor may be one or more of a strain gauge or a piezoelectric sensor. In embodiments wherein a mass sensor, such as the mass sensor 160, is utilized, a weight of the substrate support is measured to determine a growth rate and a total thickness of the layer grown during the operation 306. The mass sensor may be an optical strain gauge or a piezoelectric sensor. A difference in the mass of the substrate support at a beginning of the operation 306 is measured and the mass of the substrate support at an end of the operation 306 is measured. The mass at the beginning of the operation 306 and the mass at the end of the operation 306 are compared to determine the growth rate and the total thickness of the layer. Comparing the mass at the beginning of the operation 306 to the mass at the end of the operation 306 includes finding a difference between the beginning mass and the end mass of the substrate support. The growth profile on the substrate support may be approximated utilizing a model or the growth profile may be assumed to be uniform over the substrate support. Periodic additional mass measurements may be taken during the growth of the layer on the substrate to create a growth rate curve.

Once the layer is grown on the substrate support to a desired thickness, such as the first thickness $T_1$, the growing of the layer on the substrate support is ceased. The layer may also be grown for a desired amount of time, such as the first time period, before the thickness of the layer is measured after growth for the desired amount of time. Once the growing of the layer on the substrate support is ceased, another operation 308 of etching the layer from the substrate support is performed. Etching the layer during the operation 308 includes a cleaning process for the inside surface of the processing volume 136. The cleaning process includes the introduction of an etchant or a cleaning gas into the processing volume. The cleaning gas is flowed into the processing volume and across the top surface of the substrate support to etch the layer which was previously grown on the substrate support. While etching the layer during the operation 308, the temperature of the processing volume and/or the substrate support is maintained at the first temperature.

The etchant and/or cleaning gas includes a chlorine containing gas, a hydrogen containing gas, and/or a fluorine containing gas. In some embodiments, any one or a combination of boron trichloride ($BCl_3$), chlorine ($Cl_2$), ethane ($C_2F_6$), carbon tetrafluoride ($CF_4$), octa fluoropropane ($C_3F_8$), octafluorocyclobutane ($C_4F_8$), fluoroform ($CHF_3$), difluoromethane ($CH_2F_2$), hydrogen bromide (HBr), hydrogen chloride (HCl), ammonia ($NH_3$), hydrogen fluoride (HF), nitrogen trifluoride ($NF_3$), or sulfur hexafluoride ($SF_6$) are utilized. In some embodiments, hydrogen chloride (HCl) or $Cl_2$ is utilized.

During and/or after etching the layer on the substrate support during the operation 308, an etch rate of the operation 308 is determined. The etch rate may be determined using one or more sensors disposed within the process chamber. In some embodiments, the one or more calibration sensors are utilized, such as one or a combination of a camera, a pyrometer, or a reflectometer, may be utilized to determine a second thickness $T_2$ or an etch rate. Alternatively, the mass sensor is utilized to determine the second thickness $T_2$ or the etch rate. The mass sensor may be one or more of a strain gauge or a piezoelectric sensor. In some embodiments, the second thickness $T_2$ is about 0 nm, such that the layer is completely etched from the substrate support.

The etch rate of the layer on the substrate support is measured using one or more of a first etch measurement method, a second etch measurement method, or a third etch measurement method. The first etch measurement method utilizes the measured emissivity of the substrate support and the known first thickness $T_1$ to determine the etch rate. The second etch measurement method utilizes a pyrometer and/or a reflectometer to measure the intensity of radiation reflected from the substrate support. The third etch measurement method utilizes a mass sensor, such as a strain gauge or a piezoelectric sensor, to determine a change in mass of the substrate support and the corresponding etch rate.

During the first etch measurement method, the calibration sensor 155 is a camera and the camera is configured to measure the emissivity of the substrate support. The first thickness $T_1$ is known by performing one of the processes previously described herein. In some embodiments, the first thickness $T_1$ is known from the first thickness determining method. In other embodiments, the first thickness $T_1$ is known from one of the second thickness determining method or the third thickness determining method. The camera is configured to measure the emissivity of the substrate support and/or the layer disposed on the substrate support. While the layer is disposed on the substrate support, the emissivity of the may vary slightly, but generally stays within a first range of a first value.

When the layer has been removed and at least part of the substrate support is exposed, the emissivity changes sharply to a second value outside of the first range. Whether the jump in emissivity is to a higher or a lower emissivity is at least partially dependent upon the wavelength being measured by the camera, the material of the layer, and the material of the substrate support. The jump in emissivity and the time at which the jump occurs is recorded. The recorded time at which the emissivity jump occurs may be subtracted from the start time to obtain an etch time. The first thickness $T_1$ is layer divided by the etch time to obtain an etch rate using the first etch measurement method during an operation 310. In some embodiments, the layer is a silicon layer and the substrate support is aluminum, such that a jump between emissivity of silicon and aluminum is recorded as the etch time.

During the second etch measurement method, the pyrometer and/or the reflectometer measure the removal of the layer over time. The removal of the layer is determined by recording the intensity of certain wavelengths of a radiation beam as the radiation beam reflects off of the top surface of the substrate support and the layer as described in FIG. 2B. The intensity may form an oscillating curve due to the constructive and destructive interference caused by the changing thickness of the layer. When the layer is fully removed and the top surface of the substrate support is exposed, the change in the measured intensity may be seen at a detection point. The change in measured intensity may be similar to the change in emissivity measured during the first etch measurement method.

Figure 5B:
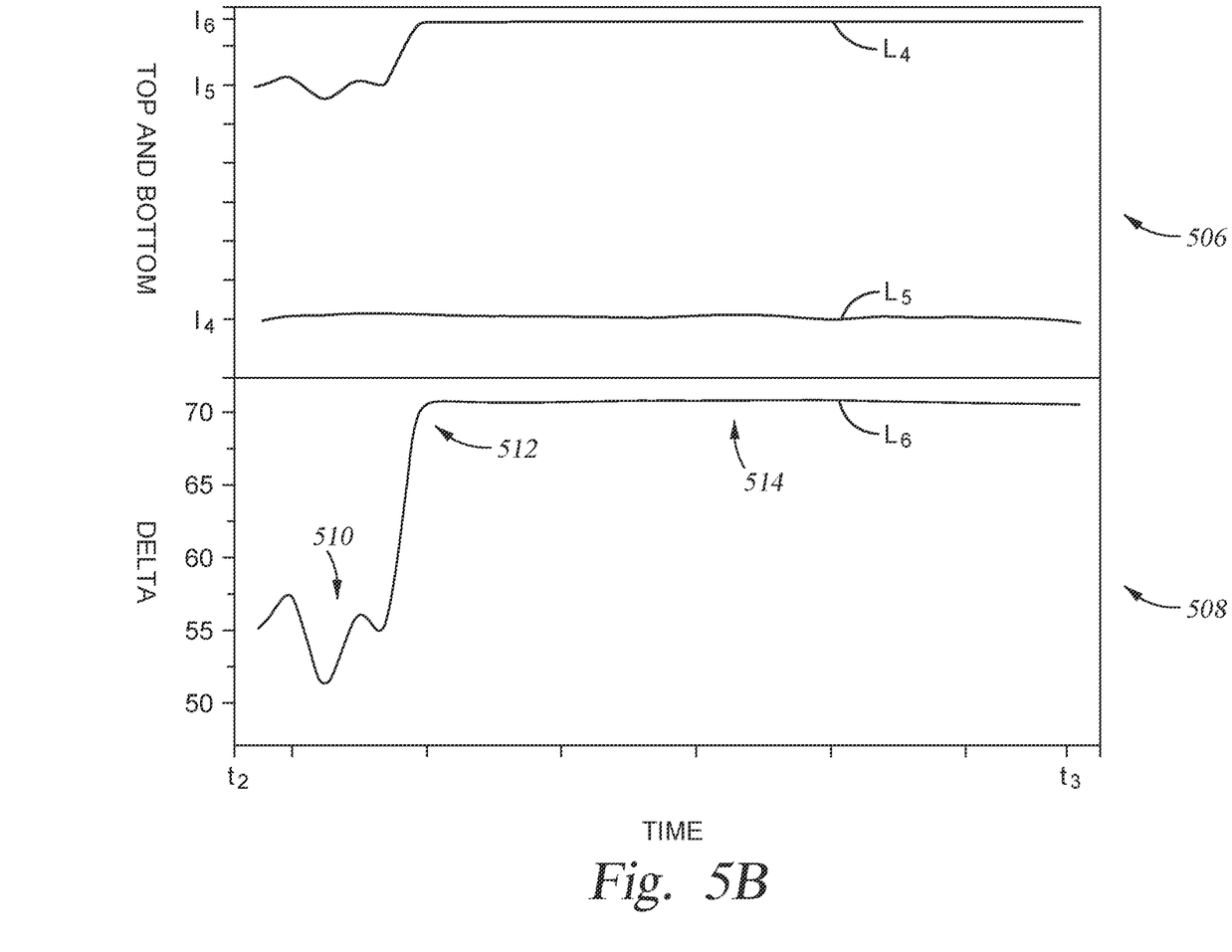

FIG. 5B is one illustration of a graph 525 which may be utilized to determine the etch rate and/or etch endpoint using a pyrometer and/or a reflectometer. The graph 525 measures intensity over time, such that intensity measurements begin at a third time $t_2$ and end at a fourth time $t_3$. The third time $t_2$ is an initial measurement start time or an initial recording start time. The fourth time $t_3$ is an end measurement time or a final recorded time. As seen in an upper portion 506 of the graph 525, a fourth intensity curve $L_4$ and a fifth intensity curve $L_5$ are measured using one or more pyrometers and/or reflectometers. The fourth intensity curve $L_4$ is the intensity of radiation reflected off of the top surface of the substrate support and the layer. The fourth intensity curve $L_4$ is measured using a pyrometer and/or a reflectometer disposed above the substrate support, such as the calibration sensor 155. The pyrometer and/or reflectometer is configured to have a narrow measurement band to reduce interference with other stray radiation within the process chamber, thus improving measurement accuracy. The intensity of the fourth intensity curve $L_4$ varies over time while a layer is being etched from the substrate support. The varying intensity over time is attributed to the radiation beam reflected off of the substrate support changing from constructive to destructive interference and vice versa as the thickness of the layer increases.

The fifth intensity curve $L_5$ is the intensity of radiation reflected off of the bottom surface of the substrate support. The fifth intensity curve $L_5$ is measured using a pyrometer and/or a reflectometer disposed below the substrate support, such as the lower calibration sensor 149. The pyrometer and/or reflectometer is configured to have a narrow measurement band to reduce interference with stray radiation within the process chamber. The intensity of the fifth intensity curve $L_5$ is shown to be relatively constant at a fourth intensity $I_4$. The fourth intensity $I_4$ is mostly constant as the layer was not grown on the bottom surface of the substrate support and therefore there is no constructive or destructive interference caused by the etching of the layer. The fourth intensity curve $L_4$ however, varies between a fifth intensity $I_5$ and a sixth intensity $I_6$ as the fourth intensity curve $L_4$ oscillates between constructive and destructive interference.

A difference between each of the fifth intensity curve $L_5$ and the fourth intensity curve $L_4$ is taken to obtain a sixth intensity curve $L_6$ as shown in the lower portion 508 of the graph 525. The fifth intensity curve $L_5$ serves as a baseline intensity curve, such that variation caused by factors other than etching of a layer on the substrate support may be removed from the fourth intensity curve $L_4$. Therefore, an intensity of the sixth intensity curve $L_6$ is the difference in intensity between the fourth intensity curve $L_4$ and the fifth intensity curve $L_5$.

The sixth intensity curve $L_6$ includes a partial etch portion 510, a detection point 512, and a full etch portion 514. The partial etch portion 510 is the portion of the data taken while the layer is being etched and the thickness is decreasing. The detection point 512 is the point at which the layer is fully etched and the material being measured by the pyrometer and/or reflectometer changes from the material of the layer to the material of the substrate support surface. The full etch portion 514 is the data taken after the layer has been fully etched. The difference in time between a fourth time $t_4$, at which the detection point 512 is located, and the second time $t_2$ is the total etch time. Using the total etch time and the previously determined total thickness of the layer, the etch rate of the layer is determined.

During the third etch measurement method, a mass sensor, such as the mass sensor 160, is utilized. The mass sensor measures a weight or a mass of the substrate support to determine an etch rate of the layer during the operation 310. The mass sensor may be an optical strain gauge or a piezoelectric sensor. While the layer is disposed on the substrate support at the first thickness $T_1$, the mass of the substrate support is a first mass. As the layer is etched, the thickness of the layer is reduced to a second thickness $T_2$ less than the first thickness $T_1$. The mass of the substrate support when the layer has the second thickness $T_2$ is less than the mass of the substrate support when the layer has the first thickness $T_1$. The mass of the substrate support continues to decrease as the layer is etched until the layer is completely removed from the substrate support.

A difference in the mass at a beginning of the operation 310 is compared to the mass at an end of the operation 310 to determine the etch rate of the layer during the operation 310. Periodic additional mass measurements may be taken to create an etch rate curve. In some embodiments, the end of the operation 310 is during a partial etch, such that the etch rate is more uniform across the substrate support between the beginning and the end of the operation 310.

After determining the etch rate during the operation 310, the etch rate is stored relative to the first temperature during an operation 312. The etch rate may be stored in the controller 120, such as in the memory device 135. Storing the first etch rate during the operation 312 may be the end of the first procedure. After storing the etch rate and the first temperature during the operation 312, each of the operations 304, 306, 308, 310, and 312 are repeated at a second temperature to determine a second etch rate during a second procedure. The second temperature is different from the first temperature. In some embodiments, the second temperature is greater than the first temperature. The second temperature may be greater than about 1000° C., such as greater than about 1100° C. Each of the operations 304, 306, 308, 310, and 312 may then be subsequently performed a third time at a third temperature to determine a third etch rate, a fourth time at a fourth temperature to determine a fourth etch rate, and a fifth time at a fifth temperature to determine a fifth etch rate. Each of the operations 304, 306, 308, 310, and 312 may be looped a pre-determined number of times to obtain a desired data set of temperature measurements relative to etch rates within the processing volume. The temperature delta between iterations may be, for example, 10 degrees Celsius or more, such as 50 degrees Celsius or more, such as 100 degrees Celsius, or more. As a substrate is not utilized within the processing volume during the operations 304, 306, 308, 310, and 312, the method 300 is may be performed rapidly and autonomously of any processes performed in connected process chambers.

The etch rates and the temperatures stored during the operation 310 are subsequently utilized to determine a temperature curve 422 of the etch rates. The temperature curve is similar to the graph 400 of FIG. 4. The graph 400 illustrates a measured temperature as the dependent variable 402 and etch rates as an independent variable 404. The etch rates stored during the operation 310 are graphed, such that the first etch rate at the first temperature is a first point 406. A second etch rate at the second temperature is a second point 408. A third etch rate at the third temperature is a third point 410. A fourth etch rate at the fourth temperature is a fourth point 412. A fifth etch rate at the fifth temperature is a fifth point 414. A sixth etch rate at a sixth temperature is a sixth point 416. A seventh etch rate at a seventh temperature is a seventh point 418. An eighth etch rate at an eighth temperature is an eighth point 420. Each of the points 406, 408, 410, 412, 414, 416, 418, and 420 are utilized to find a temperature curve 422. The temperature curve 422 is an estimate of etch rates at any given temperature within a pre-determined range. The etch rate is at least partially dependent upon the temperature of the substrate support and the processing region.

Figure 4:
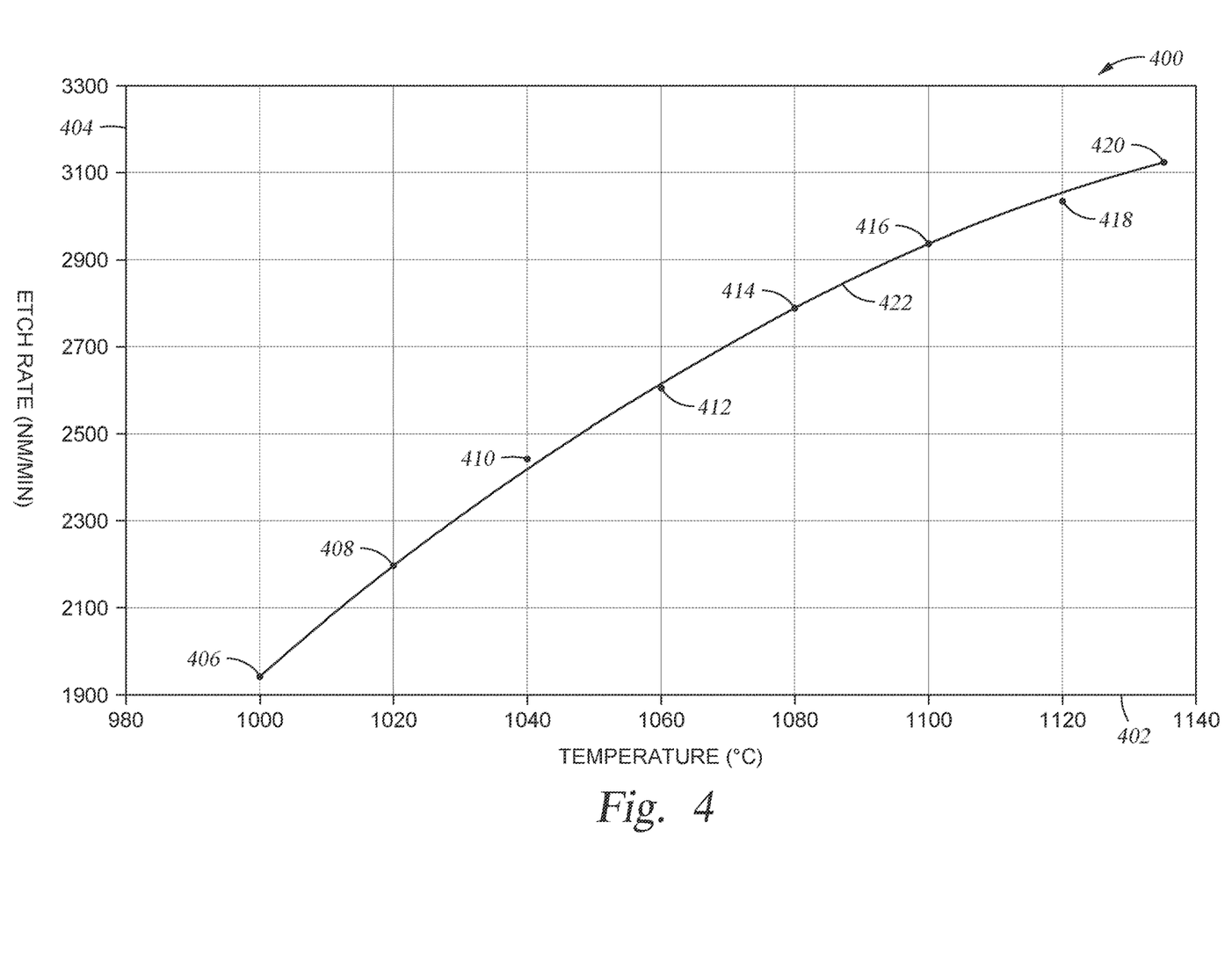
FIG. 4 is a graph illustrating a temperature curve and corresponding etch rates.

A calibrated temperature curve similar to the temperature curve 422 is stored in the controller 120. The calibrated temperature curve may be determined either using a fully calibrated process chamber similar to the process chamber being utilized. Alternatively, the calibrated temperature curve is based off of previous iterations of the method 300, such as when a process chamber is initially configured.

Since processing conditions, such as gas flow rate/pressure have been calibrated, the calibrated temperature curve and the temperature curve 422 are compared. Comparing the calibrated temperature curve and the temperature curve 422 determined using the operation 314 enables a temperature offset of the temperature curve 422 to be determined. The temperature offset may be due to aging of components within the process chamber and/or buildup of films on components within the process chamber, or other process drift considerations. Once the temperature offset is determined, a temperature offset value is applied to one or more of the temperature sensors, the lamps, or a model within the controller during an operation 316.

The temperature offset is configured to reduce the difference between temperatures measured by one or more temperature sensors and the actual temperature. Alternatively, the temperature offset is configured to reduce the difference between a simulated temperature and the actual temperature. The simulated temperature is a temperature of the processing volume and/or the substrate support simulated in a model of the process. The actual temperature is the actual temperature of the processing volume and/or the substrate support while running the process within the processing volume. In some embodiments, the temperature offset is utilized to adjust a process model and/or one or more input parameters of the process chamber. The one or more input parameters adjusted during the operation 316 may be a flow rate of a process gas, a power applied to one or more heaters and/or lamps, or a pressure within the processing volume. In another example, the temperature offset value is used to correct a temperature reading of pyrometers within the process chamber.

In a similar method to that described above, each of the operations 302, 304, 306, 308, 310, 312, 314, 316 may optionally be repeated to obtain a second temperature curve. The second temperature curve is utilized to determine if the temperature offset has been corrected and/or if a separate process condition or a chamber component is inaccurate. The second temperature curve is also compared to the calibration temperature curve. If the second temperature curve falls outside of a set tolerance range, an error is reported to the controller. In some embodiments, the set tolerance range is an average temperature difference of greater than about 2° C., such as greater than about 4° C., such as greater than about 5° C., such as greater than about 10° C. The set tolerance range may be a percent error of the etch rate or a percent difference between the etch rates. In some embodiments, the set tolerance range is an etch rate with a percent error of greater than about 0.5%, such as greater than about 1%, such as greater than about 2%.

After the calibration of operation 316, a substrate may be moved into the processing volume and onto the substrate support to perform a process on the substrate during an operation 318. The process may be a deposition or an etch process. In some embodiments, the process is an epitaxial deposition process. The process during the operation 318 may be run a plurality of times on a plurality of different substrates. The previous operations 302, 304, 306, 308, 310, 312, 314, 316 of the method 300 improve the accuracy of deposition during the operation 318.

In some embodiments, a modified version of the method 300 is performed. In the modified version of the method 300, a substrate is disposed on the substrate support 106 and the layer 204 is grown and etch from the substrate top surface during the operations 306, 308.

While the foregoing is directed to embodiments of the present disclosure, other and further embodiments of the disclosure may be devised without departing from the basic scope thereof, and the scope thereof is determined by the claims that follow.

What is claimed is:

1. A method of calibrating a temperature of a process chamber, suitable for use in semiconductor manufacturing, comprising:
    performing a first procedure comprising:
        (a) flowing a gas into a process volume while the process volume is at a first pressure;
        (b) setting a temperature of a substrate support within the process volume to a first temperature;
        (c) depositing a first layer of a film on a top surface of the substrate support using the gas, the first layer having a first thickness and the top surface of the substrate support does not include a substrate disposed thereon;
        (d) etching the first layer of the film from the substrate support at the first temperature;
        (e) determining an etch rate of the etching the first layer at the first temperature; and
        (f) storing the etch rate relative to the first temperature at a first temperature etch rate;
    repeating each of operations (a)-(f) at a second temperature different from the first temperature to obtain a second temperature etch rate;
    determining a measured temperature curve from at least the first temperature etch rate and the second temperature etch rate; and
    comparing the measured temperature curve to a calibration temperature curve.

2. The method of claim 1, wherein the gas is a silicon containing gas and the first layer is a silicon containing layer.

3. The method of claim 2, wherein etching the first layer is performed by introducing an etchant gas.

4. The method of claim 1, wherein comparing the measured temperature curve to the calibration temperature curve further comprises determining an average difference between the measured temperature curve and the calibration temperature curve and performing a temperature correction to temperature sensors within the process chamber or adjusting an input parameter of the process chamber.

5. The method of claim 4, further comprising:
    determining a second measured temperature curve after performing the temperature correction; and
    comparing the second measured temperature curve to the calibration temperature curve.

6. The method of claim 1, wherein the first temperature and the second temperature are greater than about 1000° C.

7. The method of claim 1, wherein the etch rate is determined using one or more pyrometers, one or more cameras, one or more strain gauges, or one or more piezoelectric sensors.

8. The method of claim 1, further comprising performing a temperature correction to temperature sensors within the process chamber or adjusting an input parameter of the process chamber.

9. The method of claim 1, wherein the first temperature etch rate is determined using a pyrometer measuring a wavelength of about 400 nm to about 3700 nm.

10. A method of determining a temperature of a process chamber, suitable for use in semiconductor manufacturing, comprising:
    performing a first procedure comprising:
        (a) flowing a gas into a process volume;
        (b) setting a temperature of a substrate support within the process volume to a first temperature;
        (c) depositing a first layer on a top surface of the substrate support using the gas, the first layer having a first thickness and the top surface does not include a substrate disposed thereon;
        (d) etching the first layer from the substrate support at the first temperature to a second thickness less than the first thickness; and
        (e) determining a first temperature etch rate of the etching the first layer at the first temperature using one or more pyrometers, one or more cameras, one or more strain gauges, or one or more piezoelectric sensors;
    repeating each of operations (a)-(e) within the first procedure at a second temperature different from the first temperature to obtain a second temperature etch rate; and
    determining a measured temperature curve from at least the first temperature etch rate and the second temperature etch rate.

11. The method of claim 10, wherein a flow rate of the gas and a pressure of the process volume are calibrated before performing the first procedure.

12. The method of claim 10, wherein the first thickness is determined using one or more pyrometers, one or more cameras, one or more strain gauges, or one or more piezoelectric sensors.

13. The method of claim 10, wherein the gas is a silicon containing gas and the first layer is a silicon containing layer.

14. The method of claim 13, wherein etching the first layer is performed by introducing an etchant gas.

15. The method of claim 14, wherein the etchant gas is a hydrogen containing gas or a chlorine containing gas.

16. The method of claim 15, wherein the etchant gas is a hydrogen chloride containing gas.

17. The method of claim 10, wherein the first temperature etch rate is determined using a pyrometer measuring a wavelength of about 400 nm to about 3700 nm.

18. A method of determining a temperature of a process chamber, suitable for use in semiconductor manufacturing, comprising:
    performing a first procedure comprising:
        (a) flowing a deposition gas into a process volume;
        (b) setting a temperature of a substrate support within the process volume to a first temperature;
        (c) depositing a silicon containing layer on a top surface of the substrate support using the deposition gas, the silicon containing layer having a first thickness and the top surface of the substrate support does not include a substrate disposed thereon;
        (d) monitoring constructive interference, destructive interference, or both the constructive interference and the destructive interference of reflected radiation during depositing the silicon containing layer to determine the first thickness of the silicon containing layer using one or more pyrometers, one or more reflectometers, or both one or more pyrometers and one or more reflectometers;

(e) etching the silicon containing layer from the substrate support using an etching gas at the first temperature to a second thickness less than the first thickness; and (f) determining a first temperature etch rate of the etching the silicon containing layer at the first temperature;

repeating each of operations (a)-(f) within the first procedure at a second temperature different from the first temperature to obtain a second temperature etch rate; and determining a measured temperature curve from at least the first temperature etch rate and the second temperature etch rate.

19. The method of claim 18, wherein determining the first temperature etch rate comprises:

monitoring constructive interference, destructive interference, or both the constructive interference and the destructive interference of reflected radiation during etching the silicon containing layer to determine the second thickness of the silicon containing layer using the one or more pyrometers, the one or more reflectometers, or both the one or more pyrometers and the one or more reflectometers.

20. The method of claim 19, wherein the first temperature etch rate is determined using the one or more pyrometers measuring a wavelength of about 400 nm to about 3700 nm.

* * * * *